(12) United States Patent
Wang et al.

(10) Patent No.: US 11,063,596 B1
(45) Date of Patent: Jul. 13, 2021

(54) FRAME DECODING CIRCUIT AND METHOD FOR PERFORMING FRAME DECODING

(71) Applicants: Global Unichip Corporation, Hsinchu (TW); Taiwan Semiconductor Manufacturing Company, Ltd., Hsinchu (TW)

(72) Inventors: Ting-Hao Wang, Hsinchu (TW); Ting-Chin Cho, Hsinchu (TW); Hui-Ting Yang, Hsinchu (TW); Yung-Sheng Fang, Hsinchu (TW); Chang-Ming Liu, Hsinchu (TW); Igor Elkanovich, Hsinchu (TW); Amnon Parnass, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/143,175

(22) Filed: Jan. 7, 2021

(51) Int. Cl.
| | |
|---|---|
| *H03L 7/081* | (2006.01) |
| *H04L 27/26* | (2006.01) |
| *H03K 3/037* | (2006.01) |
| *H03L 7/099* | (2006.01) |

(52) U.S. Cl.
CPC .......... *H03L 7/0816* (2013.01); *H03K 3/037* (2013.01); *H03L 7/0818* (2013.01); *H03L 7/0992* (2013.01); *H04L 27/2656* (2013.01)

(58) Field of Classification Search
CPC ......... G09G 3/3648; G09G 2340/0435; G09G 2360/18; H03L 7/0816
See application file for complete search history.

(56) References Cited

U.S. PATENT DOCUMENTS

| | | | | |
|---|---|---|---|---|
| 4,744,079 A | * | 5/1988 | Csapo ..................... | H04L 12/64 370/463 |
| 5,400,370 A | * | 3/1995 | Guo ....................... | H03L 7/0814 375/371 |
| 6,424,349 B1 | * | 7/2002 | Kim ....................... | G09G 3/2007 345/531 |
| 7,373,454 B1 | * | 5/2008 | Noe ........................ | H03M 9/00 711/108 |
| 9,766,288 B2 | | 9/2017 | Huang et al. | |
| 10,037,293 B2 | | 7/2018 | Chen et al. | |
| 10,127,169 B2 | | 11/2018 | Su | |
| 10,152,445 B2 | | 12/2018 | Su | |
| 10,261,928 B2 | | 4/2019 | Chen et al. | |
| 2002/0015447 A1 | * | 2/2002 | Zhou ...................... | H04N 1/212 375/240.25 |

(Continued)

*Primary Examiner* — Adam D Houston
(74) *Attorney, Agent, or Firm* — JCIPRNET (57) ABSTRACT

A frame decoding circuit implemented in an IC die includes a frame synchronizer, receiving an input clock signal and an input frame signal in serial form, to provide an output clock signal. A phase shift of the output clock signal is adjusted according to a detected code by sampling the input frame signal at a center point for every two bits and the detected code being not a correct type. The input clock signal is divided in frequency with the phase shift for providing the output clock signal. A de-serializer unit receives the input frame signal, the input data, the output clock signal from the frame synchronizer, a delay-locked-loop clock signal to de-serialize the input frame signal and the input data for output.

26 Claims, 8 Drawing Sheets

(56) References Cited

U.S. PATENT DOCUMENTS

| | | | |
|---|---|---|---|
| 2003/0007581 A1* | 1/2003 | Agazzi | H04L 25/03057 375/341 |
| 2003/0184569 A1* | 10/2003 | Koga | G09G 3/2003 345/690 |
| 2004/0080671 A1* | 4/2004 | Siemens | H04N 21/4355 348/473 |
| 2004/0098690 A1* | 5/2004 | Joseph | G06F 30/39 716/129 |
| 2006/0227916 A1* | 10/2006 | Masui | H04L 7/0337 375/355 |
| 2013/0176485 A1* | 7/2013 | Aiba | G09G 3/3611 348/441 |
| 2017/0256189 A1* | 9/2017 | Kawaguchi | G09G 3/3648 |
| 2020/0395340 A1* | 12/2020 | Lee | H01L 23/5386 |

\* cited by examiner

| VSS | T_DBI0 | VDDP | T_DBI1 | VSS | T_DBI2 | VDDP | T_DBI3 |
|---|---|---|---|---|---|---|---|
| T_D0 | T_D1 | T_LR0 | T_D2 | T_D3 | T_D4 | T_D5 | T_D6 |
| T_D7 | VSS | T_D8 | VDDP | T_D9 | VSS | T_D10 | VDDP |
| T_D11 | T_D12 | T_FR | T_DCKP | T_DCKN | T_D13 | T_D14 | T_D15 |
| VDDP | T_D16 | VSS | T_D17 | VDDP | T_D18 | VSS | T_D19 |
| T_PAR | T_D20 | T_D21 | T_D22 | T_D23 | T_LR1 | T_D24 | T_D25 |
| T_D26 | VDDP | T_D27 | VSS | T_D28 | VDDP | T_D29 | VSS |
| T_FC1 | T_FC0 | T_D30 | T_D31 | R_D31 | R_D30 | R_FC0 | R_FC1 |
| VSS | R_D29 | VDDP | R_D28 | VSS | R_D27 | VDDP | R_D26 |
| R_D25 | R_D24 | R_LR1 | R_D23 | R_D22 | R_D21 | R_D20 | R_PAR |
| R_D19 | VSS | R_D18 | VDDP | R_D17 | VSS | R_D16 | VDDP |
| R_D15 | R_D14 | R_D13 | R_DCKN | R_DCKP | R_FR | R_D12 | R_D11 |
| VDDP | R_D10 | VSS | R_D9 | VDDP | R_D8 | VSS | R_D7 |
| R_D6 | R_D5 | R_D4 | R_D3 | R_D2 | R_LR0 | R_D1 | R_D0 |
| R_DBI3 | VDDP | R_DBI2 | VSS | R_DBI1 | VDDP | R_DBI0 | VSS |

FRAME DECODING CIRCUIT AND METHOD FOR PERFORMING FRAME DECODING

BACKGROUND

Technical Field

The invention is related to interface between two integrated circuit (IC) dies for data communication and more particularly to a frame decoding circuit and method for performing frame decoding.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 2.5D semiconductor device, in which several circuit chips may be integrated as a larger integrated circuit, in which the contact elements, interposer or RDL layer are used to connect between the chips.

The packaging technology Integrated Fan-Out (InFO) and chip-on-wafer-on-substrate (CoWoS) have been proposed to package multiple chips assembled side by side.

As to a whole electronic circuit, the main circuit may be fabricated based on the 2.5D packaging technology. In addition, multiple application-specific integrated circuits (ASIC) dies and serializer/deserialized (SerDes) dies may be additionally disposed on the main circuit in connection with each other through the interconnection interfaces, which involves a parallel bus.

The interfaces of two dies to be connected usually include contact element patterns, respectively, for connection to each other. The contact element pattern of a die includes a plurality of contact elements for connection to the contact elements of another die. As a result, the parallel bus are effectively set up between two IC dies in data communication, in which the contact elements of transmitting part of one die are connected to the contact elements of receiving part of another IC die.

However, each contact element between the two IC dies in communication may pass a serial data signal to speed up the data transmission. In this situation, the serialized data as received by the IC die at the receiving-side should be de-serialized into parallel data. How to ensure the received data in serial form as received to be properly de-serialized with proper clock timing is still an issue in development.

SUMMARY

The invention provides a frame decoding circuit and method for performing frame decoding. An input frame signal with the coding is verifying in the interface of the IC die at the receiving side. The input frame signal allows the clock signal to have proper timing, which may be used to efficiently and correctly de-serialize the input data in serial form.

In an embodiment, the invention provides a frame decoding circuit, implemented in an integrated circuit (IC) die. The IC die converts an input data in serial form as received to an output data in de-serial form. The frame decoding circuit includes a frame synchronizer, receiving an input clock signal and an input frame signal in serial form, to provide an output clock signal. A phase shift of the output clock signal is adjusted according to a detected code by sampling the input frame signal at falling edge of the input clock signal. The input clock signal has also been divided in frequency with the phase shift for providing the output clock signal. In addition, a de-serializer unit receives the input frame signal, the input data, the output clock signal from the frame synchronizer, and a delay-locked-loop (DLL) clock signal to de-serialize the input frame signal and the input data for outputting a frame code and a de-serialized data.

In an embodiment, the invention also provides a method for performing frame decoding, used in an integrated circuit (IC) die, wherein the IC die converts an input data in serial form as received to an output data in de-serial form. The method for performing frame decoding includes providing a frame synchronizer for receiving an input clock signal and an input frame signal in serial form, to provide an output clock signal. A phase shift of the output clock signal is adjusted according to a detected code by sampling the input frame signal at falling edge or rising edge of the input clock signal. The input clock signal has also been divided in frequency with the phase shift for providing the output clock signal. The method further includes providing a de-serializer unit, for receiving the input frame signal, the input data, the output clock signal from the frame synchronizer, a delay-locked-loop (DLL) clock signal to de-serialize the input frame signal and the input data for outputting a frame code and a de-serialized data.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention is directed to an interface between two integrated circuit (IC) dies for data communication, in which a frame decoding circuit and a method for performing frame decoding are further provided to at least correctly de-serialize the input data based on the coded frame signal.

At to the semiconductor fabrication, the interface for a 2.5D semiconductor device may be taken, in which dies are disposed on an interposer or RDL. The contact element patterns of the dies are configured to have geometrically symmetric relation. The dies are more freely connected through the interface. The routing lengths between contact elements in routing may also be more equally and shortly set.

In communication through the interface, the parallel data at the transmitting die usually are serialized into bit string in serial form. Various signals including the bit string are transmitted to another die, as a receiving die, through the interface. The interface provides a parallel bus for transmitting the signals in serial form. Then, the receiving die needs to de-serialize the input data signals correctly, so as to correctly obtain the communication data as transmitted.

Several embodiments are provided for describing the invention but the invention is not just limited to the embodiments.

The whole integrated circuit may be fabricated by the semiconductor fabrication processes as a semiconductor device, which may be fabricated based on stack structure of 2.5D semiconductor device. The interface of the dies to receive data may include the frame decoding circuit in association with the de-serialized circuit. In an embodiment, the interface in semiconductor structure is integrated in the circuit of the whole die.

Figure 1:
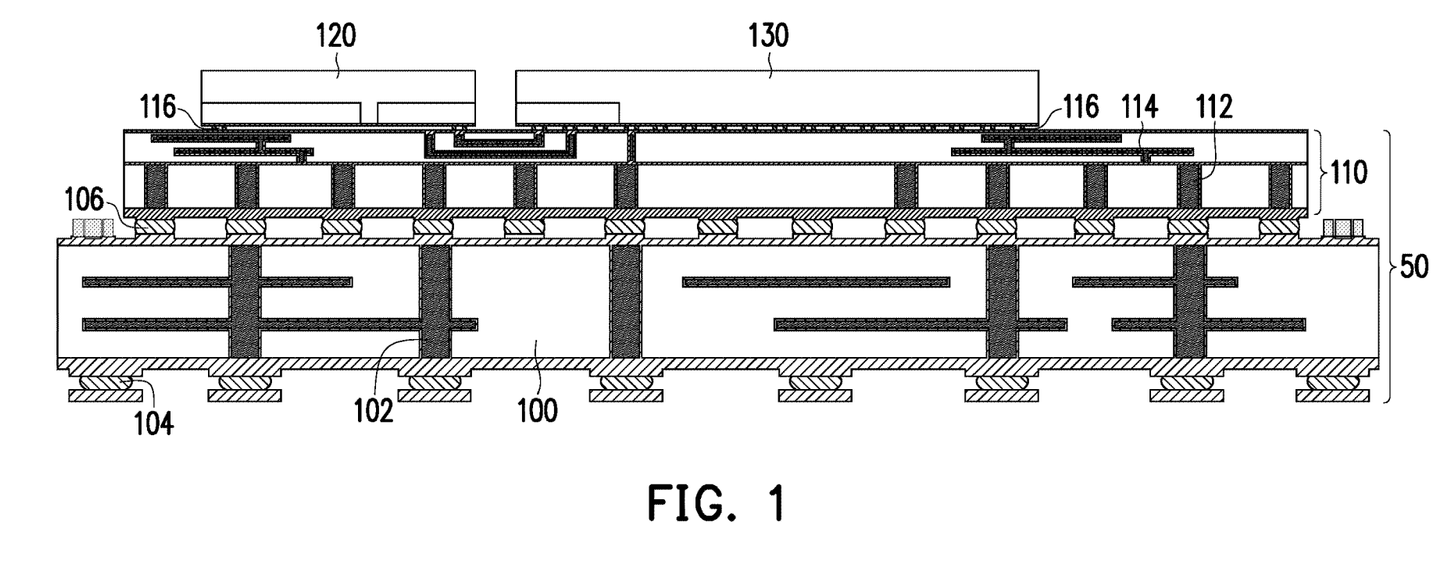
FIG. 1 is a drawing, schematically illustrating a cross-sectional stack structure of 2.5D semiconductor device with an interface, according to an embodiment of the invention.

The semiconductor fabrication is firstly described. FIG. 1 is a drawing, schematically illustrating a cross-sectional stack structure of 2.5D semiconductor device with an interface, according to an embodiment of the invention. Referring to FIG. 1, in further application, the CoWoS or InFO platform 50 with the intended IC structure is formed based on the 2.5D packaging technology. The CoWoS or InFO platform 50 may include a package substrate 100, which has the bottom solder balls 104 and the top contact elements 106. The via 102 may be used for connecting from the bottom solder balls 104 to the top contact elements 106. Further, interposer or RDL 110, may be further formed on the substrate 100 with the connection of the contact elements 106. The interposer or RDL 110 may also include the TSV 112, the interconnection routing 114, and the contact elements 116.

In actual application, the CoWoS or InFO platform 50 may also be implemented with additional dies, such as the ASIC die 130 and SerDes die 120. The ASIC die 130 and SerDes die 120 are connected through the routing 114 and the contact elements 116. One ASIC die 130 may connect with multiple SerDes die 120 for various peripheral communication.

Figure 2:
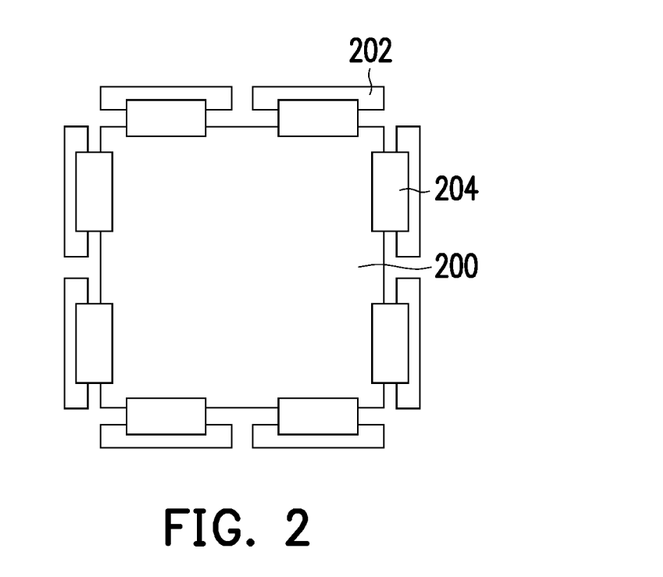
FIG. 2 is a drawing, schematically illustrating the interfaces for one die to connect to multiple other dies through the interfaces, according to an embodiment of the invention.

FIG. 2 is a drawing, schematically illustrating the interfaces for one die to connect to multiple other dies through the interfaces, according to an embodiment of the invention. Referring to FIG. 2, one IC die 200, such as a processor or ASIC die, may connect with multiple dies 202 through the interface 204. The interface 204 involves a parallel bus to communicate between the die 200 and the dies 202. The interface 204 may include routing and the contact elements in a contact element pattern, so that die 200 to die 202 may be connected.

Figure 3:
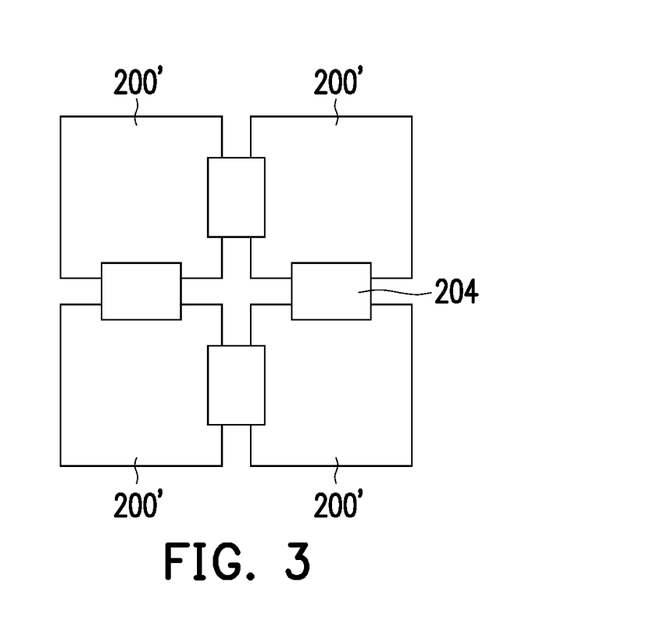
FIG. 3 is a drawing, schematically illustrating the interfaces for connection between multiple processor dies, according to an embodiment of the invention.

FIG. 3 is a drawing, schematically illustrating the interfaces for connection between multiple processor dies, according to an embodiment of the invention. Referring to FIG. 3, in another application, multiple processors 200' may be connected together to form a large processor with more powerful function. In this situation, these processors 200' are also connected by the interfaces 204.

As foregoing description, the 2.5D packaging process may be applied to stack various dies together side by side without substantially further consuming the device area. However, to allow the die to be more freely connected together, the contact elements in the interface 204 need to be properly arranged in compact manner and further be symmetric for receiving and transmitting signals. The communication between two die 200 to die 202 may be easily disposed at the peripheral region. Here, interface 204 may also referring to Glink interface as provided in the market.

Figure 4:
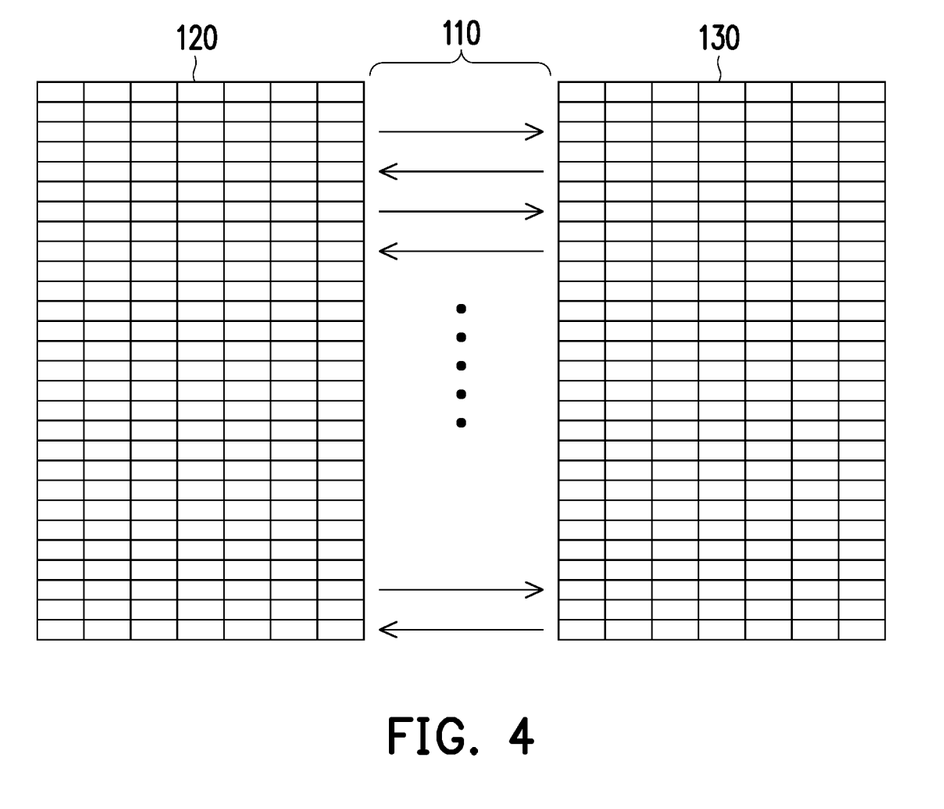
FIG. 4 is a drawing, schematically illustrating a communication between two dies based on the interface with the interposer or RLD, according to an embodiment of the invention.

FIG. 4 is a drawing, schematically illustrating a communication between two dies based on the interface with the interposer or RLD, according to an embodiment of the invention. Referring to FIG. 4, in an example, the ASIC die 130 and SerDes die 120 are communicating through the interposer or RDL 110. The contact elements of the ASIC die 130 and SerDes die 120 to contact to the interposer or RDL 110 are properly arranged. Each contact element may transmit one specific signal at the same time. As a result, the parallel bus is set up based on the contact elements. The signals at each contact element are in a serial form, such as a bit string.

Figure 5:
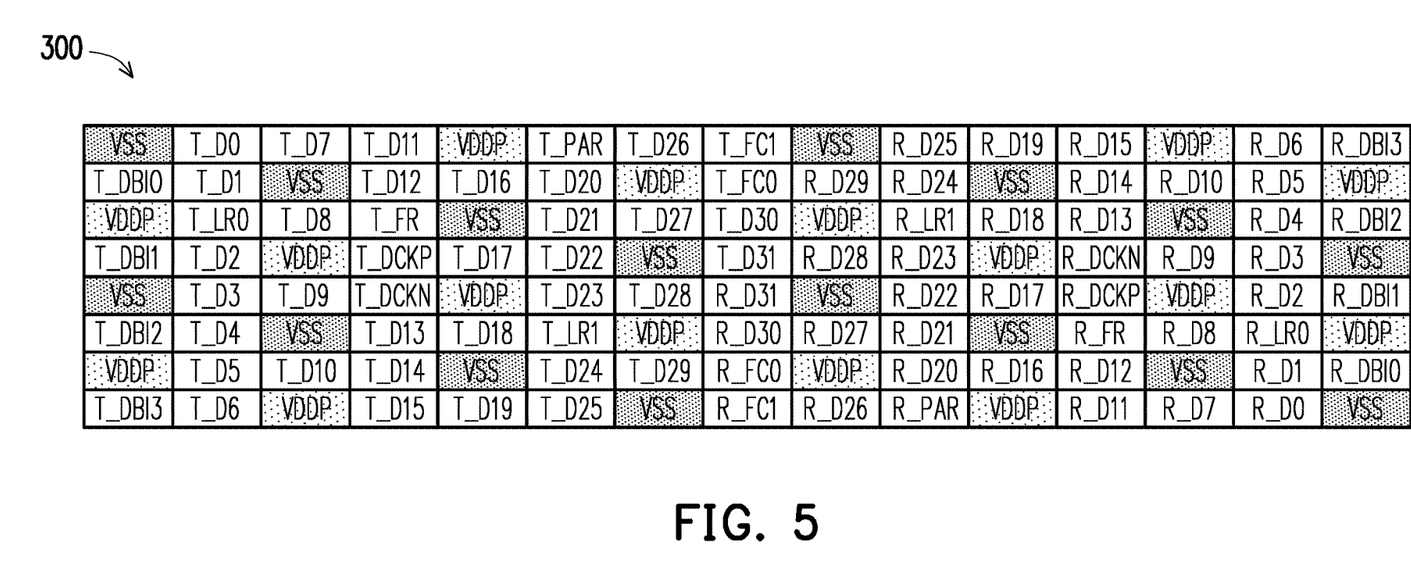
FIG. 5 is a drawing, schematically illustrating the structure of the contact element pattern, according to an embodiment of the invention.

FIG. 5 is a drawing, schematically illustrating the structure of the contact element pattern, according to an embodiment of the invention. Referring to FIG. 5, the total number of the contact elements involved in the interface may be a number and signals are communicating in parallel for transmitting and receiving.

The total number of the contact elements involved in the interface may be a large number. The signals are communicating in parallel between dies for transmitting and receiving. Depending on the size of the data in one bus, a data size of 32 bits with operation voltages and other function signals are set as one slice referred to a contact element pattern 300. The contact element pattern 300 may be replicated up to a certain number, such as 8, to adapt the total data size in parallel communication. In an example, the data is corresponding to 32 bits with a sequence of R_D0 to R_D31 and T_D0 to T_D31, on which T represents the contact element for transmitting and R represents the contact element for receiving. In addition, multiple low voltage signals VSS and multiple high voltage VDDP are also included in the contact element pattern 300. In addition, various function signals are also included, including FRAM T/R_FR; Clock T/R_DCK_P/N; Flow control T/R_FC[1:0]; DBI T/R_DBI [3:0]; Parity T/R_PAR; and Lane Repair T/R_LR[1:0]. However, the contact elements for the functional signals are just not limited to the embodiment.

Table 1 is an example to define the contact elements for one transmitting (T) group or receiving (R) group. The transmitting group and the receiving group have the same number of contact elements.

TABLE 1

| Contact element type | number | definition |
| --- | --- | --- |
| Data, T/R [31:0] | 32 | Data bits synchronous to CLK |
| FRAME, T/R_FRAME | 1 | FRAME bit synchronous to CLK |
| Clock, T/R_DCK_P/N | 2 | CLK differential pair |
| Flow Control, T/R_FC[1:0] | 2 | Asynchronous and in different direction to data bus |
| DBI, T/R_DBI[3:0] | 4 | One DBI per byte, serving to invert bus content for better SSO (single sign-on) |
| Parity, T/R_PAR | 1 | One per 32 bits, serving to identify error cases |
| Lan Repair, T/R_LR[1:0] | 2 | Lane repair bits, being used to repair data, parity and DBI, not used to repair CLK, FRAME and FC signals |

Based on the interposer or RDL 110 as described above, the various signals are communicated between two dies. However, in an example, a set of parallel signals in communication may be converted into a serial form to transmit/receive through one routing with one contact element. Once the data signals in serial form is received by the IC die, the IC die would de-serialize the data signals into a parallel form.

To assure the data signal in serial form to be correctly de-serialized, in an embodiment, a frame signal is provided to define N-bit data in each set. N in an example is 8 but the invention is not limited to 8. The parameter N is determined according to the actual data transmission algorithm. Here, 8-bit data form on byte. The following example takes 8-bit signal as an example for descriptions.

Figure 6:
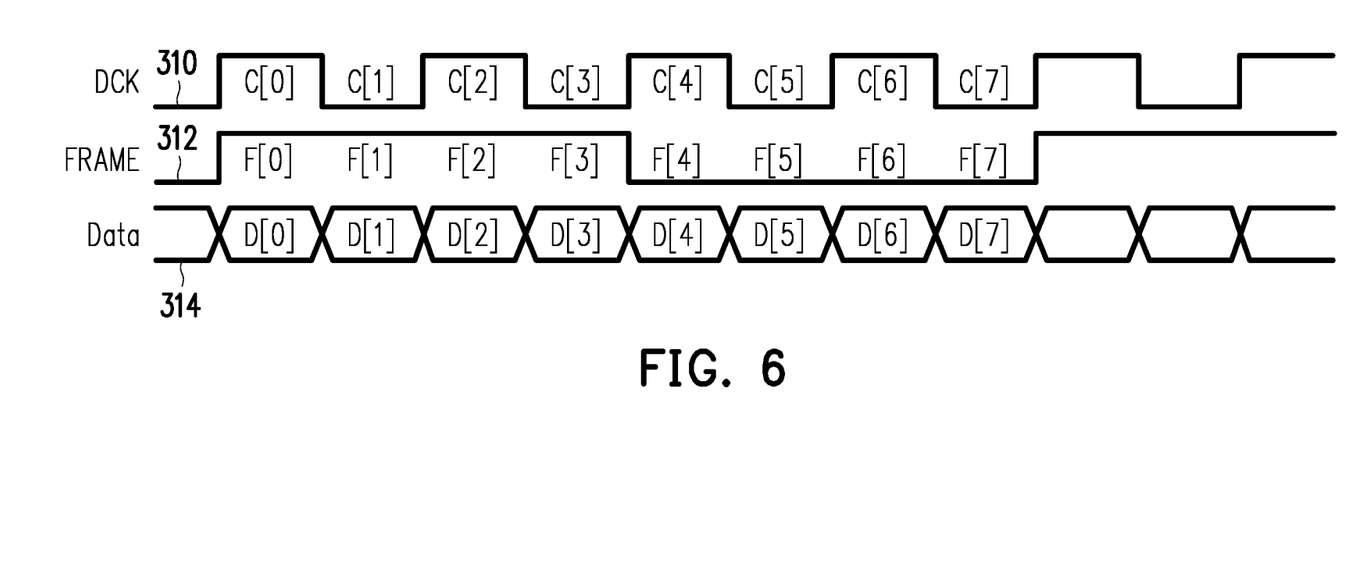
FIG. 6 is a drawing, schematically illustrating a mechanism for the frame signal to define the data based on the clock, according to an embodiment of the invention.

FIG. 6 is a drawing, schematically illustrating a mechanism for the frame signal to define the data based on the clock, according to an embodiment of the invention. Referring to FIG. 6, in an embodiment, the clock signal 310 as also indicated by DCK, the frame signal 312 as also indicated by FRAME and the data signal 314 as also indicated by Data are respectively and parallelly transmitted from three contact elements of an IC die at the transmitting side. Then, the IC die at the receiving side would respectively and parallelly receive the signals. As noted, the clock signal 310, the frame signal 312 and the data signal 314 are in a serial form and need to be de-serialized into parallel data.

The clock signal 310 is continuously received by the IC die at the receiving side to serve as the timing reference for sampling the various signals. The data signal 314 is also continuously received by the IC die. However, the data signals are a packet to transmit N-bit data, such as 8-bit data, in each time. Here, N is not just limited to 8. However, the following description takes 8-bit data as a packet to transmit in an example.

N-bit data such as 8-bit data of D[0], D[1], D[2], D[3], D[4], D[5], D[6] and D[7], each of which is corresponding to one bit. To recognize this 8-bit data, the frame signal 312 is also transmitted and then received. The size of the frame signal 312 is also N-bit, such as 8-bit, so as to frame the 8-bit data.

The frame signal 312 with 8 bits is produced, having the waveform extending over four clock cycles in double data rate form. In other word, the size of the frame signal 312 would define N-bit data in serial form.

The waveform of the frame signal 312 in an example has a rule to set up. The rule requires that the frame signal 312 only has the "1" state at the leading part and the "0" state at the end part. Further, at least two continuous bits with the state of "1" for the leading part and at least two continuous bits with the state of "0" for the ending part. In an example, the first four bits F[0] to F[3] are "1111" and the last four bits F[4] to F[7] are "0000". In an embodiment, the frame signal 312 may require that every adjacent two bits have the same state of "1" or "0". This also indicated that the first two bits may be "11" in correct type while "00", "01" and "10" are not expected for the two bits of the frame signal 312.

The frame signal 312 is used to adjust clock phase of the output clock signal, which is to sample the data, and also correctly define the N-bit data. The data signal 314 represents various signals in serial form, in which the content of the data signal 314 needs to be de-serialized into parallel form.

Figure 7:
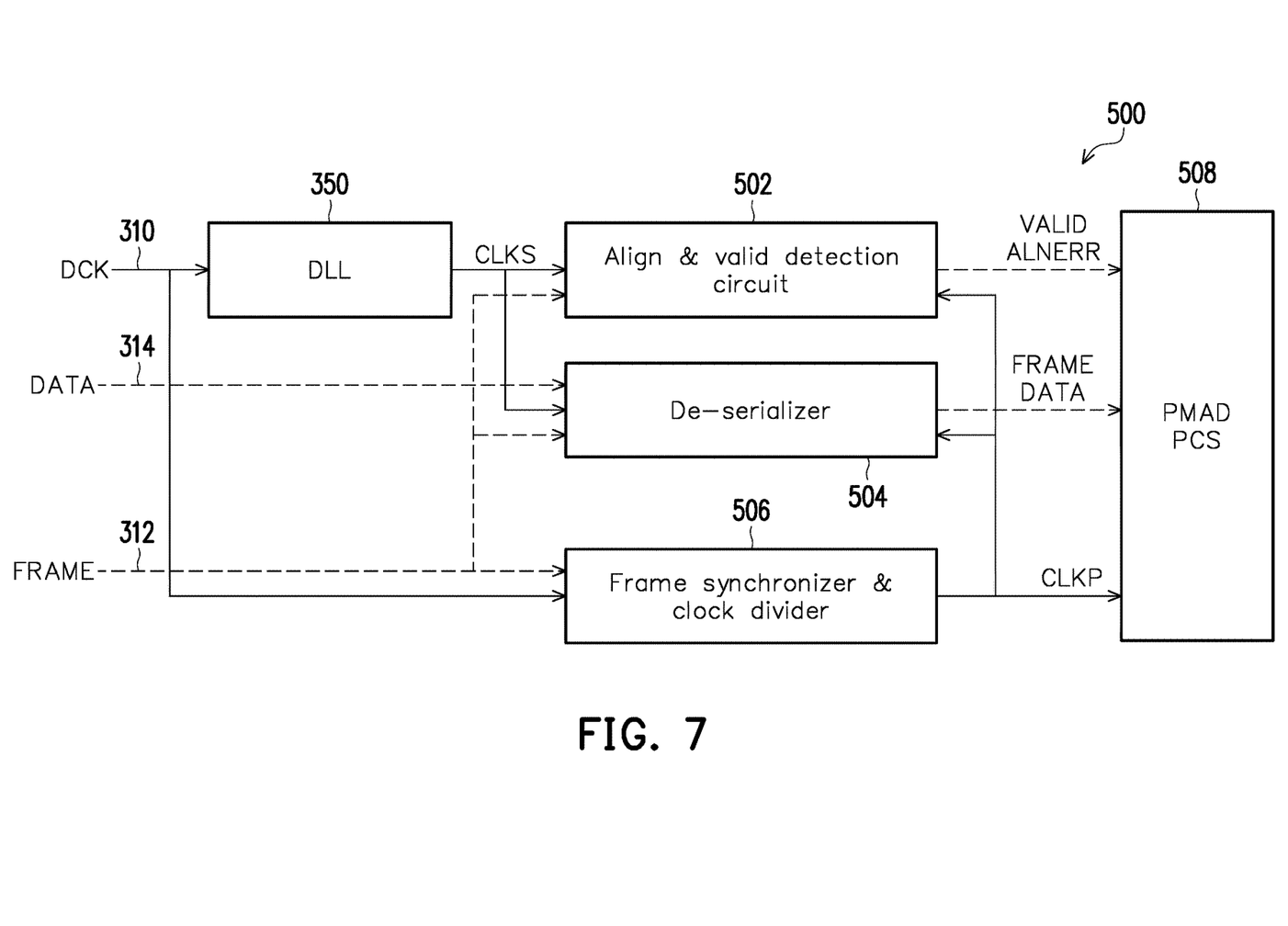
FIG. 7 is a drawing, schematically illustrating a circuit structure for a frame decoding circuit, according to an embodiment of the invention.

FIG. 7 is a drawing, schematically illustrating a circuit structure for a frame decoding circuit, according to an embodiment of the invention. Referring to FIG. 7, the frame decoding circuit 500 is implemented in the interface of the IC die to receive the clock signal 310, the frame signal 312 and the data signal 314. In an embodiment, the frame decoding circuit 500 includes a DLL unit 350, a frame synchronizer & clock divider 506, a de-serializer 504, and an align & valid detection circuit 502. The output of the frame decoding circuit 500 are provided to the external circuit 508 such as PMAD (Physical Medium Attachment Digital)/PCS (Physical Coding Sublayer) for further application.

The clock signal 310 is input to serving as the clock reference for various operations. In an embodiment, the DLL unit 350 receives the clock signal 310 to adjust into a delay-locked-loop (DLL) clock, CLKS, which is further input to the align & valid detection circuit 502 and the de-serializer 504. In addition, the frame synchronizer & clock divider 506 also receives the clock signal 310 to adjust a clock phase used in the IC die.

As stated in FIG. 6, the frame signal 312 is used to define the N-bit data as transmitted in serial form, the timing of the frame signal 312 needs to be synchronize with the output clock signal CLKP, which is actually used in operation. The frame synchronizer & clock divider 506 is described as follows.

Figure 8:
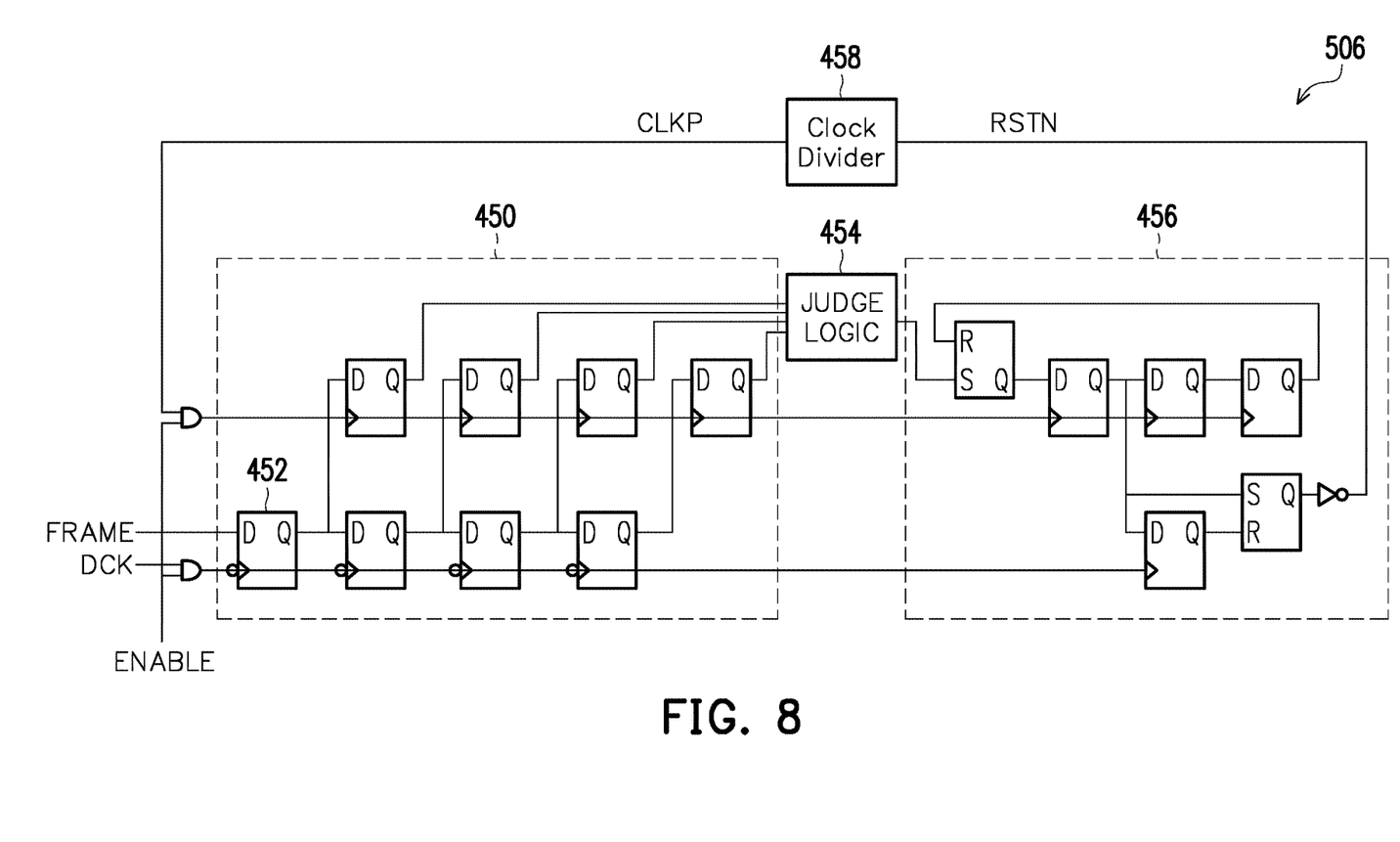
FIG. 8 is a drawing, schematically illustrating a circuit structure of the frame synchronizer, according to an embodiment of the invention.

FIG. 8 is a drawing, schematically illustrating a circuit structure of the frame synchronizer, according to an embodiment of the invention. Referring to FIGS. 7 and 8, in general, the frame synchronizer & clock divider 506 receives the clock signal 310 and the frame signal 312 in serial form, to provide an output clock signal, CLKP. A phase shift of the clock signal 310 is adjusted according to a detected code by a sampling circuit 450 for sampling the input frame signal at falling edge of the input clock signal. However, the rising edge instead of the falling edge may be taken without specific limitation. A phase shift of the clock signal 310 is taken when the detected code is not a correct type, as judged in the judge logic 454 which is to be described later. The clock signal 310 has also been divided in frequency by the clock divider 458 with the phase shift for outputting the output clock signal, CLKP. In actual operation, the clock divider 458 is reset by a rest signal RSTN. The rest signal RSTN is generated by a reset circuit 456 with the phase shift as judged by the judge logic 454.

The sampling circuit 450 is a flip-flip circuit, which includes a plurality of flip-flop (FF) 452. In an example, the frame signal 312 is a 8-bit data, then eight FFs 452 are used to cause the falling edge of the clock signal 310 to sample the frame signal 312. However, a logic AND receives the clock signal DCK and an enable signal, ENABLE to actually catch the clock signal DCK and the frame signal FRAME.

As also stated in FIG. 6, the 8-bit data involves four clock cycle, in which four falling edges are used to sample the frame signal FRAME into four-bit data, which is also de-serialized into 4-bit data, used by the judge logic 454. The judge logic 454 judges the 4-bit data whether or not a correct type. If the 4-bit data is not a correct type, the action of phase shift on the clock signal is taken.

The correct type has two types of "1xx0" or "0000" for the 4-bit data as the detected code by the sampling circuit 450, in which the bit indicated by "x" is an ignored bit. This means that the value of this bit is ignored, without taking into judgement. Here, the frame signal FRAME, 312 carries 8 bits. However, the frame signal FRAME, 312 is N-bit data, not limited to 8-bit data.

The type other than "1xx0" or "0000" is not a correct type and it implies that the waveform of the frame signal FRAME is not proper as defined. As noted, the types of "1xx0" implies at least two leading bits are at the state of "1" and the last two bits are at the state of "0". The waveform of the frame signal 312, FRAME is correct. The types of "0000" implies that no data is not transmitted. If the first bit of the 4-bit data in the judge logic 454 is "0", it implies that the frame signal 312 is not starting from "1".

The clock signal CLKP is the clock signal to be output for actual operation in de-serializer 504. The clock signal CLKP is also controlled by another logic AND to be enabled. The clock signal CLKP needs a proper phase to be able to sample the input data signal DCK, 310 at a proper time.

Figure 9:
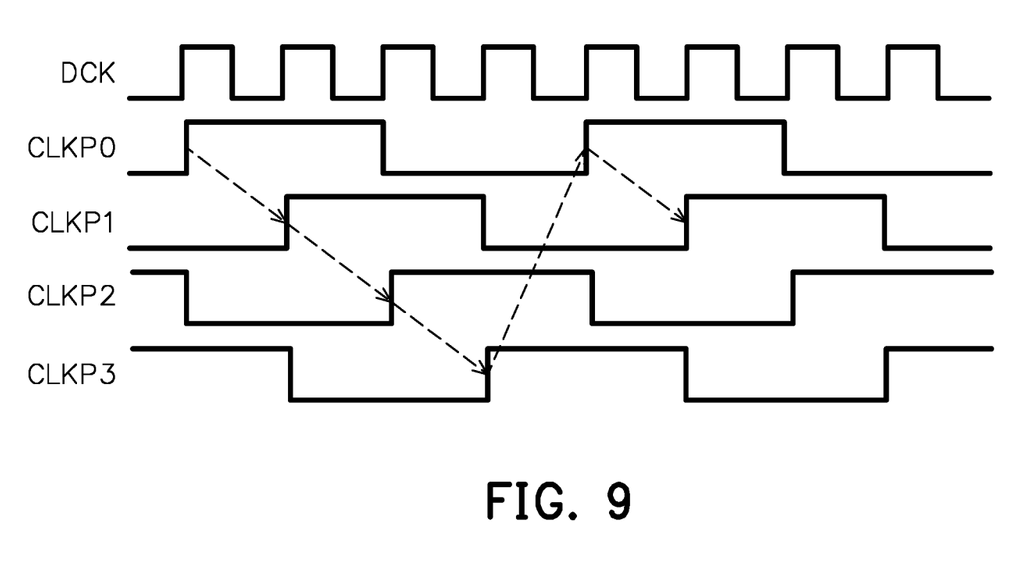
FIG. 9 is a drawing, schematically illustrating a mechanism for phase shift of the input clock.

FIG. 9 is a drawing, schematically illustrating a mechanism for phase shift of the input clock. Referring to FIG. 9, the action of the phase shift for the clock signal CLKP is following. When the detected code from the judge logic 454 is not the correct type, the phase of the clock signal CLKP would take the rising edge of the clock signal DCK at the next clock cycle. The phase shift may keep on until the frame signal has the correct type as detected.

Referring back to FIG. 7, the de-serialized 504 is further described. The de-serialized 504 is used to de-serialize the frame signal FRAME and the data signal DATA in serial form, based on the clock signal CLKP with the phase adjustment. In addition, the DLL clock CLKS is also received by the de-serializer 504 for actually de-serializing the serial signal. The circuit of the de-serializer 504 may be the one as known in the art, without specific limitation. The descriptions are omitted here. The de-serializer 504 would output the frame signal FRAME or the data signa DATA in parallel form for the external circuit 508.

The align & valid detection circuit 502 further detect the frame signal to judge whether or not the occurrence of clock error or frame error. A set of conditions are judged to drop the input data comprising:

(1) a leading bit of the input frame signal being not "1";

(2) the input frame signal being zero; and (3) a bit of "1" within the input frame signal being additionally detected but a bit of "0" before the bit of "1" is also detected although the leading bit of the input frame signal is "1".

If the frame signal 312 does not fall into the above conditions (1), (2) and (3), the data are judged as the right data and are taken for subsequent use. Otherwise, the data are doped due to the error occurs. Error counting may be taken. In examples, when the condition (1) occurs, an alignment error in the input frame signal is determined, wherein a counting of alignment error is added by one. In addition, when the condition (3) occurs, a frame error in the input frame signal is determined, wherein a counting of frame error is added by one.

The condition (1) implies that the frame signal cannot get "frame rising edge" at the expected position, and get "1" within 8 bits after the expected position, in which the expected position is the leading bit. The condition implies that the leading bit of the frame signal is not "1" and this bit "1" is shifted to other bit position. The condition (1) causes an output signal of alignment error ALNERR. The condition (2) implies that the frame signal cannot get "frame rising edge" at the expected position, and get all "0" within 8 bits after the expected position. This implies that the data currently are not transmitted. Any data received in this condition are not the actual data and should be dropped. The condition (3) implies that the frame signal gets the "frame rising edge" at the expected position, but gets unexpected frame code, not satisfying the rules to set the frame signal as previously described in FIG. 6. The condition (2) implies that no data is transmitted and the frame signal is invalid. The condition (3) causes an output signal VALID for indicating whether the frame is an illegal frame.

As viewed in a method for performing frame decoding, in an example, the invention also provides the method for performing frame decoding, used in an integrated circuit (IC) die, wherein the IC die converts an input data in serial form as received to an output data in de-serial form. The method for performing frame decoding includes providing a frame synchronizer for receiving an input clock signal and an input frame signal in serial form, to provide an output clock signal. A phase shift of the output clock signal is adjusted according to a detected code by sampling the input frame signal at falling edge of the input clock signal and a phase shift of the input clock signal is taken when the detected code is not a correct type. The input clock signal has also been divided in frequency with the phase shift for providing the output clock signal. The method further includes providing a de-serializer unit, for receiving the input frame signal, the input data, the output clock signal from the frame synchronizer, a delay-locked-loop (DLL) clock signal to de-serialize the input frame signal and the input data for outputting a frame code and a de-serialized data. Providing an align-valid detection circuit, for receiving the input frame signal, the DLL clock and the output clock signal from the frame synchronizer, to judge whether the input frame signal is valid or not for output a validity signal and whether the input frame signal being aligned or not for output an aligning signal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A frame decoding circuit, implemented in an integrated circuit (IC) die, wherein the IC die converts an input data in serial form as received to an output data in de-serial form, the frame decoding circuit comprising:

a frame synchronizer, receiving an input clock signal and an input frame signal in serial form, to provide an output clock signal, wherein a phase shift of the output clock signal is adjusted according to a detected code by sampling the input frame signal, wherein the input clock signal has also been divided in frequency with the phase shift for providing the output clock signal; and a de-serializer unit, receiving the input frame signal, the input data, the output clock signal from the frame synchronizer, and a delay-locked-loop (DLL) clock signal to de-serialize the input frame signal and the input data for outputting a frame code and a de-serialized data.

2. The frame decoding circuit of claim 1, wherein the input frame signal defines an N-bit data in serial form of the input data to be de-serialized into the N-bit data in parallel.

3. The frame decoding circuit of claim 1, wherein the IC die as a first die receives the input clock signal and the input frame signal from an external transmitting IC die as a second die through a parallel bus between the first IC die and the second die.

4. The frame decoding circuit of claim 1, wherein the input frame signal is an N-bit frame data in serial form.

5. The frame decoding circuit, of claim 4, wherein the N-bit data of the input frame signal is an 8-bit frame data.

6. The frame decoding circuit of claim 4, wherein the detected code with N/2 bits of the input frame signal is correct in phase when the detected code has a leading bit of "1" and an ending bit of "0" or the detected code being zero, otherwise the input frame signal is not correct in phase.

7. The frame decoding circuit of claim 6, wherein the detected code is correct in phase when a bit string is 1x . . . x0, where the bits indicated by "x . . . x" are ignored bits.

8. The frame decoding circuit of claim 7, wherein the N-bit data is an 8-bit data and the detected code is 1xx0.

9. The frame decoding circuit of claim 7, the detected code with the bit string of 1x . . . x0 corresponding to a condition that at least two beginning bits of the input frame signal is continuous in 1 and at least two ending bits of the input frame signal is continuous in 0.

10. The frame decoding circuit of claim 6, wherein when the detected code with N/2 bits of the input frame signal as judged is correct in phase, the output clock signal from the frame synchronizer remains in phase without adjusted but a clock frequency is reduced and the output clock signal is set.

11. The frame decoding circuit of claim 1, wherein the phase shift of the input clock signal is taken when the detected code is not a correct type.

12. The frame decoding circuit of claim 11, wherein the frame synchronizer comprises:
a first flip-flop circuit, comprising a plurality of first flip-flop units, receiving the input frame signal and the input clock signal and configured to sample the input frame signal at a falling edge of the input clock signal and de-serialize a sampled data into N/2-bit data;
a judge circuit, to judge whether or not the sampled data is the correct type, to determine whether the phase shift of the input clock signal is taken or not;
a second flip-flop circuit, comprising a plurality of second flip-flop units, configured to receive an output of the judge circuit to generate a clock reset signal;
clock divider, receiving the reset signal to produce a phase-adjusted clock signal;
a first logic AND, receiving the input clock signal and an enable signal to enable the input clock to enter the first flip-fop circuit; and
a second logic AND, receiving the enable signal and the phase-adjusted clock signal as feedback from the clock divider to enable de-serialization on the input frame signal.

13. The frame decoding circuit of claim 1, wherein the phase shift is shifting a phase of the output clock signal to a rising edge of a next clock cycle of the input clock signal with respect to the current clock cycle.

14. The frame decoding circuit of claim 1, further comprising an align-valid detection circuit, receiving the input frame signal, the DLL clock and the output clock signal from the frame synchronizer, to judge whether the input frame signal is valid or not for output a validity signal and whether the input frame signal being aligned or not for output an aligning signal.

15. The frame decoding circuit of claim 1, wherein the align-valid detection circuit obtains the input frame data with N-bit data and judges whether or not the input data as de-serialized is taken or dropped.

16. The frame decoding circuit of claim 15, wherein a set of conditions are judged to drop the input data comprising:
(1) a leading bit of the input frame signal being not "1";
(2) the input frame signal being zero; and
(3) a bit of "1" within the input frame signal being additionally detected but a bit of "0" before the bit of "1" is also detected although the leading bit of the input frame signal is "1".

17. The frame decoding circuit of claim 16, wherein when the condition (1) occurs, an alignment error in the input frame signal is determined, wherein a counting of alignment error is added by one.

18. The frame decoding circuit of claim 16, wherein the condition (3) occurs, a frame error in the input frame signal is determined, wherein a counting of frame error is added by one.

19. The frame decoding circuit of claim 1, wherein every adjacent two bits in sequence within the input frame signal with a correct coding have a same voltage level.

20. The frame decoding circuit of claim 1, wherein a correct coding of the input frame signal comprising only a bit string of "1" and a bit string of "0" are sequentially formed within the input frame signal.

21. A method for performing frame decoding, used in an integrated circuit (IC) die, wherein the IC die converts an input data in serial form as received to an output data in de-serial form, the method for performing frame decoding comprising:
providing a frame synchronizer for receiving an input clock signal and an input frame signal in serial form, to provide an output clock signal,
wherein a phase shift of the output clock signal is adjusted according to a detected code by sampling the input frame signal at falling edge or rising edge of the input clock signal,
wherein the input clock signal has also been divided in frequency with the phase shift for providing the output clock signal; and
providing a de-serializer unit, for receiving the input frame signal, the input data, the output clock signal from the frame synchronizer, a delay-locked-loop (DLL) clock signal to de-serialize the input frame signal and the input data for outputting a frame code and a de-serialized data.

22. The method for performing frame decoding of claim 21, further comprising:
providing an align-valid detection circuit, for receiving the input frame signal, the DLL clock and the output clock signal from the frame synchronizer, to judge whether the input frame signal is valid or not for output a validity signal and whether the input frame signal being aligned or not for output an aligning signal.

23. The method for performing frame decoding of claim 21, further comprising performing a phase shift of the input clock signal when the detected code is not a correct type.

24. The method for performing frame decoding of claim 23, wherein the frame synchronizer as provided comprises:
- a first flip-flop circuit, comprising a plurality of first flip-flop units, receiving the input frame signal and the input clock signal and configured to sample the input frame signal at a falling edge of the input clock signal and de-serialize a sampled data into N/2-bit data;
- a judge circuit, to judge whether or not the sampled data is the correct type, to determine whether the phase shift of the input clock signal is taken or not;
- a second flip-flop circuit, comprising a plurality of second flip-flop units, configured to receive an output of the judge circuit to generate a clock reset signal;
- clock divider, receiving the reset signal to produce a phase-adjusted clock signal;
- a first logic AND, receiving the input clock signal and an enable signal to enable the input clock to enter the first flip-fop circuit; and
- a second logic AND, receiving the enable signal and the phase-adjusted clock signal as feedback from the clock divider to enable de-serialization on the input frame signal.

25. The method for performing frame decoding of claim 21, wherein the align-valid detection circuit as provided obtains the input frame data with N-bit data and judges whether or not the input data as de-serialized is taken or dropped.

26. The method for performing frame decoding of claim 25, wherein a set of conditions are judged to drop the input data comprising:
  (1) a leading bit of the input frame signal being not "1";
  (2) the input frame signal being zero; and
  (3) a bit of "1" within the input frame signal being additionally detected but a bit of "0" before the bit of "1" is also detected although the leading bit of the input frame signal is "1".

\* \* \* \* \*